US010283287B2

(12) United States Patent
Sztuczka

(10) Patent No.: US 10,283,287 B2
(45) Date of Patent: May 7, 2019

(54) ELECTRICAL POWER DISTRIBUTION SYSTEM INCLUDING PRESSURE RELEASE MECHANISM

(71) Applicant: ABB Schweiz AG, Baden (CH)

(72) Inventor: Piotr Sztuczka, Bielsko-Biala (PL)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/685,262

(22) Filed: Aug. 24, 2017

(65) Prior Publication Data

US 2019/0066941 A1  Feb. 28, 2019

(51) Int. Cl.
| H01H 9/02 | (2006.01) |
| H01H 9/22 | (2006.01) |
| H01H 9/04 | (2006.01) |
| H02B 1/38 | (2006.01) |
| H01H 71/50 | (2006.01) |
| H05K 5/02 | (2006.01) |

(52) U.S. Cl.
CPC ............. *H01H 9/047* (2013.01); *H01H 9/22* (2013.01); *H01H 71/50* (2013.01); *H02B 1/38* (2013.01); *H05K 5/0208* (2013.01); *H05K 5/0247* (2013.01)

(58) Field of Classification Search
CPC .......... H01H 9/047; H01H 9/22; H01H 71/50; H02B 1/38; H05K 5/0208; H05K 5/0247
USPC ......................................................... 361/601
See application file for complete search history.

(56) References Cited

U.S. PATENT DOCUMENTS

| 4,034,170 A * | 7/1977 | Raabe ....................... H01H 9/20 |
| | | 200/330 |
| 4,194,100 A | 3/1980 | Cox et al. |
| 4,261,189 A | 4/1981 | Brumfield et al. |
| 4,293,153 A | 10/1981 | Stanback et al. |
| 4,769,739 A | 9/1988 | Bruin |
| 4,821,909 A * | 4/1989 | Hibler ..................... B65D 90/36 |
| | | 220/203.08 |
| 5,193,049 A * | 3/1993 | Jackson ............... H02B 13/025 |
| | | 361/676 |

(Continued)

FOREIGN PATENT DOCUMENTS

JP    2014045614 A    3/2014

OTHER PUBLICATIONS

Fu-Chang, F., "Exploration research on metal-enclosed switchgear design of withstanding internal arcing faults," 2015 3rd International Conference on Electric Power Equipment—Switching Technology (ICEPE-ST), pp. 101-106.

(Continued)

*Primary Examiner* — Anatoly Vortman
(74) *Attorney, Agent, or Firm* — Barnes & Thornburg LLP

(57) ABSTRACT

An electrical power distribution system includes at least one circuit protection device and a housing defining an interior space to receive the at least one circuit protection device. The housing includes a door positionable between an opened position in which the door allows access to the interior space and a closed position in which the door inhibits access to the interior space. The housing also includes a hinge pivotably coupling the door to the case and a pressure release mechanism coupled to the door and the hinge. The pressure release mechanism includes a tongue positionable between a first position and a second position and a biasing member arranged to bias the door towards the case when the door is in the closed position.

18 Claims, 7 Drawing Sheets

(56) References Cited

U.S. PATENT DOCUMENTS

| | | | |
|---|---|---|---|
| 5,414,584 A | 5/1995 | Young | |
| 5,457,296 A | 10/1995 | Neill et al. | |
| 5,710,402 A * | 1/1998 | Karnbach | H02B 1/565 218/157 |
| 5,878,905 A * | 3/1999 | Gronbach | H02B 13/025 174/17 VA |
| 5,892,195 A * | 4/1999 | Aufermann | H02B 13/025 218/157 |
| 6,407,331 B1 * | 6/2002 | Smith | H02B 13/025 174/17 VA |
| 6,417,443 B1 * | 7/2002 | Smith | H02B 1/565 174/17 VA |
| 7,054,143 B2 * | 5/2006 | Eiselt | H02B 13/025 218/155 |
| 7,236,352 B2 * | 6/2007 | Dalis | H02B 13/025 174/17 VA |
| 7,510,223 B2 * | 3/2009 | Malkowski, Jr. | E05B 15/022 292/304 |
| 7,604,534 B2 * | 10/2009 | Hill | H05K 7/20618 361/679.46 |
| 7,821,774 B2 * | 10/2010 | Josten | H02B 13/025 174/17 VA |
| 7,952,857 B1 * | 5/2011 | Motley | H02B 13/025 361/678 |
| 7,974,078 B2 * | 7/2011 | Coomer | H02B 13/025 312/236 |
| 8,733,855 B2 * | 5/2014 | Josten | H02B 13/025 174/50 |
| 8,952,252 B2 * | 2/2015 | Bugaris | H02B 13/025 174/50 |
| 9,165,731 B2 | 10/2015 | Deb et al. | |

OTHER PUBLICATIONS

Kalkstein, et al., "Safety benefits of arc-resistant metalclad medium-voltage switchgear," IEEE Transactions on Industry Applications, 31(6) (1995), pp. 1402-1411.

* cited by examiner

ELECTRICAL POWER DISTRIBUTION SYSTEM INCLUDING PRESSURE RELEASE MECHANISM

BACKGROUND

The field of the disclosure relates generally to electrical power distribution systems and, more particularly, to electrical power distribution systems including a pressure release mechanism.

At least some known electrical power distribution systems include a plurality of circuit protection devices positioned within a housing and coupled to one or more loads. Sometimes, the electrical power distribution systems experience overcurrent conditions, ground fault conditions, or other system anomalies that require the circuit protection devices to interrupt the flow of current through the circuit breakers. During such anomalies, the pressure within the housing increases and portions of the housing may be deformed and/or rendered inoperable. As a result, components of the electrical power distribution systems that are connected to the load and carry current may be exposed during and after such anomalies. In addition, such electrical power distribution systems may require repair and/or replacement after the anomalies. Moreover, people near the electrical power distribution systems may be injured by displaced and/or exposed components during such anomalies. For example, a door of the housing may be displaced and forcefully contact someone during such an anomaly.

BRIEF DESCRIPTION

In one aspect, an electrical power distribution system is provided. The electrical power distribution system includes at least one circuit protection device arranged to interrupt current flowing through a circuit. The electrical power distribution system also includes a housing defining an interior space and arranged to receive the at least one circuit protection device within the interior space. The housing includes a case defining an opening providing access into the interior space and a door positionable between an opened position in which the door allows access to the interior space and a closed position in which the door covers the opening and inhibits access to the interior space. The housing also includes a hinge pivotably coupling the door to the case. The housing further includes a pressure release mechanism coupled to the door and the hinge. The pressure release mechanism includes a tongue positionable between a first position and a second position. The tongue is coupled to the door and is arranged to allow the door to move relative to the case while the door is in the closed position. The pressure release mechanism also includes a biasing member arranged to bias the door towards the case when the door is in the closed position.

In another aspect, a pressure release mechanism for an electrical power distribution system is provided. The pressure release mechanism includes a brace arranged to couple to a case and a door of the electrical power distribution system. The door is positionable between an opened position in which the door allows access to an interior space of the case through an opening defined by the case and a closed position in which the door covers the opening and inhibits access to the interior space. The opening provides access to at least one circuit protection device positioned within the interior space of the case. The pressure release mechanism also includes a tongue extending from and movably coupled to the brace. The tongue is positionable between a first position and a second position. The tongue is coupled to the door and is arranged to allow the door to move relative to the case while the door is in the closed position. The pressure release mechanism further includes a biasing member arranged to bias the tongue towards the first position.

In yet another aspect, a method of assembling an electrical power distribution system is provided. The method includes positioning a circuit protection device within an interior space of a housing including a case and a door. The door is positionable between an opened position in which the door allows access to the interior space through an opening defined by the case and a closed position in which the door covers the opening and inhibits access to the interior space. The method further includes coupling a pressure release mechanism to the case. The pressure release mechanism includes a tongue positionable between a first position and a second position. The method also includes coupling a hinge to the door and the case such that the door is arranged to pivot between the opened position and the closed position. The method further includes coupling the hinge to the tongue. The tongue is arranged to allow the door to move relative to the case while the door is in the closed position.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Exemplary embodiments of electrical power distribution systems and methods of operating electrical power distribution systems are described herein. The exemplary electrical power distribution systems include a housing defining an interior space configured to receive a circuit protection device. The housing includes a case and a door that is positionable between an opened position and a closed position. A pressure release mechanism is coupled to the door and allows the door to move relative to the case while the door is in the closed position. In some embodiments, the pressure release mechanism includes a biasing member that biases the door towards the case. As a result, the electrical power distribution system is able to withstand overcurrent conditions, ground fault conditions, or other system anomalies. In addition, the electrical power distribution system is arranged to return to an initial position after such anomalies and does not require repairs or replacement.

Figure 1:
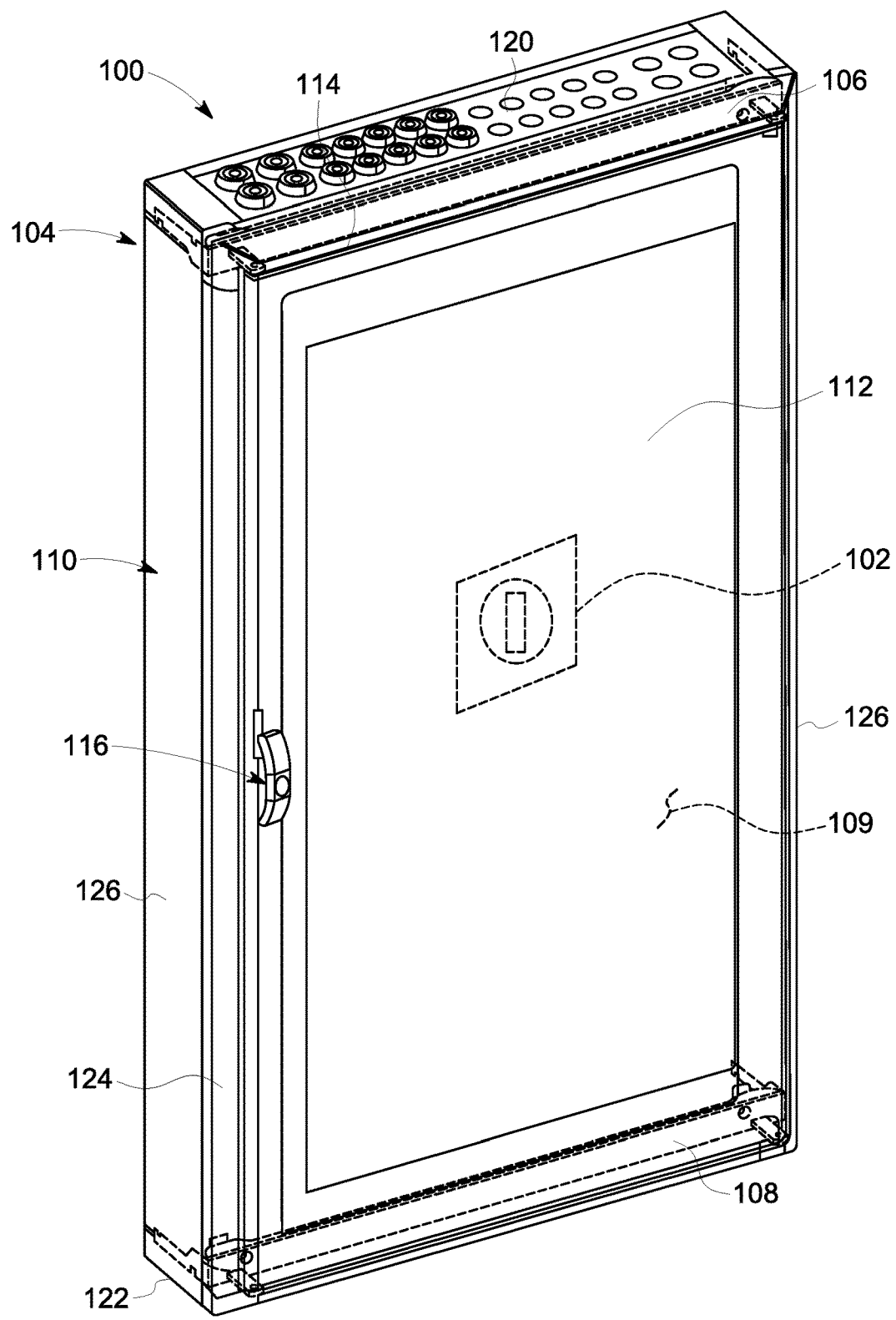
FIG. 1 is a perspective view of an example embodiment of an electrical power distribution system.

FIG. 1 is a perspective view of an electrical power distribution system 100. Electrical power distribution system 100 includes at least one circuit protection device 102, a housing 104, a first pressure release mechanism 106, and a second pressure release mechanism 108. Circuit protection device 102 is configured to couple to a circuit such that circuit protection device 102 controls flow of electric current through the circuit. In particular, circuit protection device 102 is arranged to interrupt current flowing through the circuit when anomalies such as overcurrent conditions and ground fault conditions occur. In alternative embodiments, electrical power distribution system 100 includes any circuit protection device 102 that enables electrical power distribution system 100 to operate as described herein.

In the exemplary embodiment, housing 104 defines an interior space 109 and is configured to receive circuit protection device 102 within interior space 109. Housing 104 electrically insulates electrical power distribution system 100 such that electrical current is inhibited from passing through housing 104 to the surrounding environment. Housing 104 includes a case 110 and a door 112. Case 110 defines an opening 114 which provides access to interior space 109 and to circuit protection device 102 positioned within interior space 109. Door 112 is positionable between an opened position (shown in FIG. 2) in which door 112 allows access to interior space 109 through opening 114 and a closed position (shown in FIG. 1) in which door 112 covers opening 114 and inhibits access to interior space 109. In alternative embodiments, electrical power distribution system 100 includes any housing 104 that enables electrical power distribution system 100 to operate as described herein.

Also, in the exemplary embodiment, when door 112 is in the opened position, interior space 109 of housing 104 and circuit protection device 102 are accessible for inspection and maintenance. In the exemplary embodiment, door 112 includes a handle assembly 116 for positioning door 112 between the opened position and the closed position. Handle assembly 116 is arranged to engage first pressure release mechanism 106 and second pressure release mechanism 108 when door 112 is in the closed position. In the exemplary embodiment, door 112 is rectangular. In alternative embodiments, electrical power distribution system 100 includes any door 112 that enables electrical power distribution system 100 to operate as described herein.

In addition, in the exemplary embodiment, case 110 includes a top 120, a bottom 122, a front 124, and sides 126. Sides 126 extend between top 120 and bottom 122 along opposite edges of front 124. Front 124 defines opening 114 which provides access to interior space 109. In the exemplary embodiment, door 112 is substantially planar with front 124 when in the closed position and extends at an angle relative to front 124 when in the opened position. In the closed position, door 112 defines a first plane. In alternative embodiments, housing 104 includes any case 110 that enables electrical power distribution system 100 to operate as described herein. For example, in some embodiments, front 124 is omitted. In further embodiments, opening 114 is defined by at least one of top 120, bottom 122, and sides 126.

Moreover, in the exemplary embodiment, first pressure release mechanism 106 and second pressure release mechanism 108 are coupled to housing 104 and extend between case 110 and door 112. First pressure release mechanism 106 and second pressure release mechanism 108 are configured to allow door 112 to move relative to case 110 when door 112 is in the closed position. In particular, first pressure release mechanism 106 and second pressure release mechanism 108 allow door 112 to move in a direction substantially perpendicular to front 124 such that door 112 defines a second plane substantially parallel to and spaced from the first plane. For example, first pressure release mechanism 106 and second pressure release mechanism 108 allow displacement of door 112 when pressure within interior space 109 is above a threshold value. The displacement of door 112 reduces the forces on housing 104 and reduces pressure within interior space 109. As a result, first pressure release mechanism 106 and second pressure release mechanism 108 prevent damage to electrical power distribution system 100 during anomalies such as overcurrent conditions and ground fault conditions. In alternative embodiments, first pressure release mechanism 106 and second pressure release mechanism 108 have any configuration that enables electrical power distribution system 100 to operate as described herein. For example, in some embodiments, first pressure release mechanism 106 and/or second pressure release mechanism 108 are coupled to and allow displacement of at least one of top 120, bottom 122, front 124, and sides 126.

Also, in the exemplary embodiment, first pressure release mechanism 106 and second pressure release mechanism 108 are interchangeable. Accordingly, first pressure release mechanism 106 and second pressure release mechanism 108 reduce the cost to assemble electrical power distribution system 100. In alternative embodiments, electrical power distribution system 100 includes any pressure release mechanism 106, 108 that enables electrical power distribution system 100 to operate as described herein. For example, in some embodiments, electrical power distribution system 100 includes a pressure release mechanism 106, 108 extending continuously about door 112.

In addition, in the exemplary embodiment, first pressure release mechanism 106 is coupled to front 124 adjacent top 120, and second pressure release mechanism 108 is coupled to front 124 adjacent bottom 122. Accordingly, first pressure release mechanism 106 and second pressure release mechanism 108 are arranged to extend along opposite sides of door 112 when door 112 is in the closed position. Moreover, first pressure release mechanism 106 and second pressure release mechanism 108 are coupled to door 112 adjacent each corner of door 112. In particular, first pressure release mechanism 106 and second pressure release mechanism 108 receive respective hinge pins 136 adjacent first and second corners of door 112. Door 112 is pivotable on pins 136 and moves between the opened position and the closed position. In addition, handle assembly 116 selectively engages first pressure release mechanism 106 and second pressure release mechanism 108 adjacent third and fourth corners of door 112 to retain door 112 in the closed position. In alternative embodiments, first pressure release mechanism 106 and second pressure release mechanism 108 are coupled to housing 104 in any manner that enables electrical power distribution system 100 to operate as described herein. For example, in some embodiments, first pressure release mechanism 106 and/or second pressure release mechanism 108 is coupled to any of top 120, bottom 122, front 124, and sides 126 of housing 104.

Figure 2:
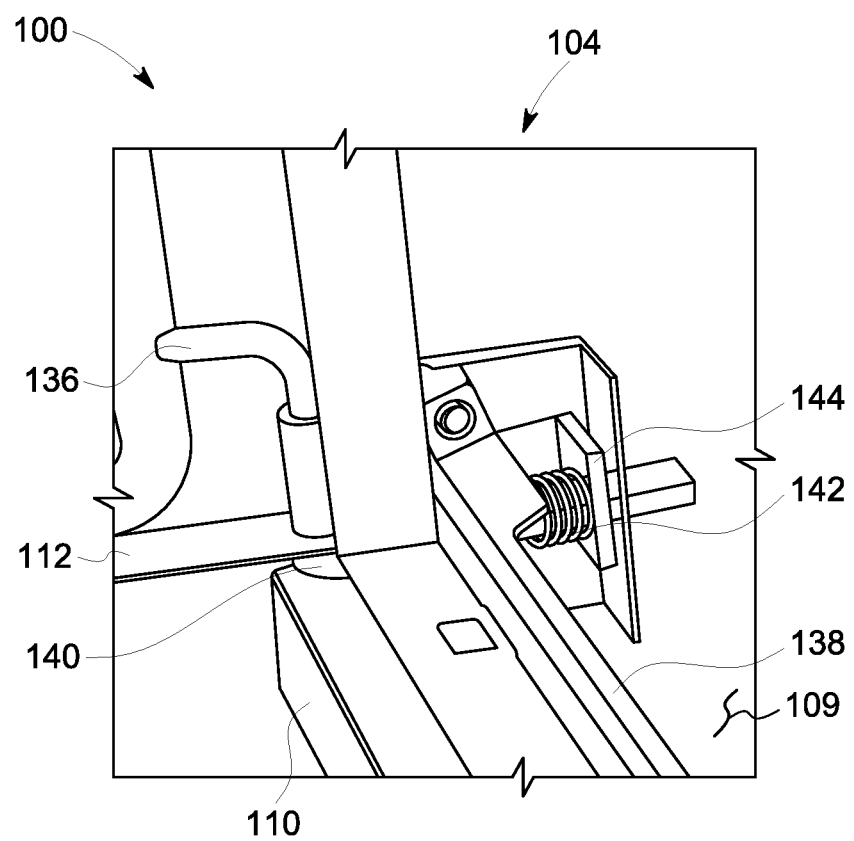
FIG. 2 is an enlarged perspective view of a portion of the electrical power distribution system shown in FIG. 1, and including a door in an opened position.
Figure 3:
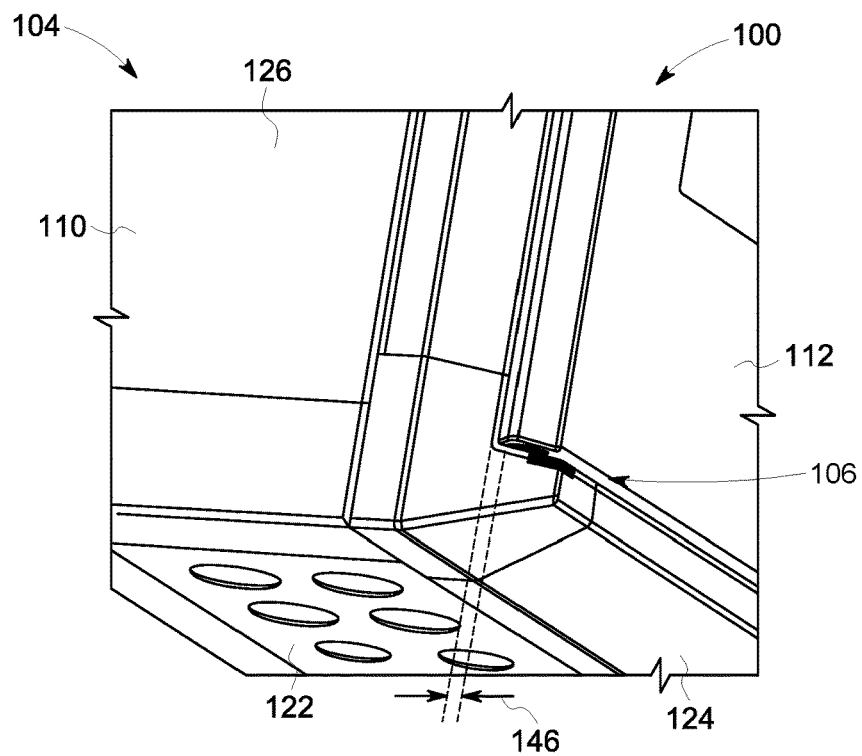
FIG. 3 is an enlarged perspective view of a portion of the electrical power distribution system shown in FIG. 1, and including a pressure release mechanism in a first position.
Figure 4:
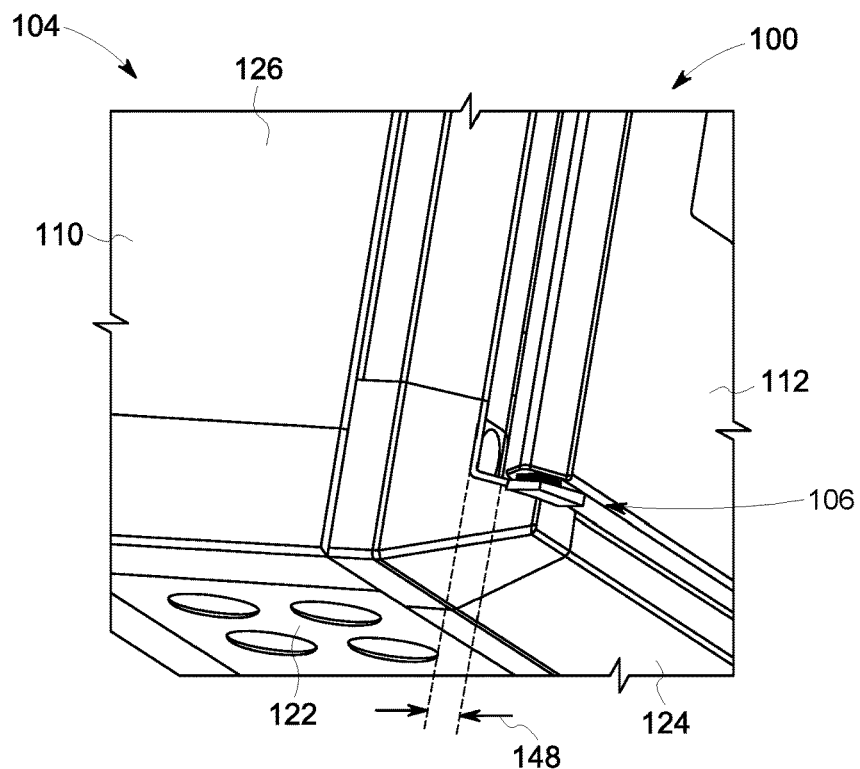
FIG. 4 is an enlarged perspective view of a portion of the electrical power distribution system shown in FIG. 1, and including the pressure release mechanism in a second position.

FIG. 2 is an enlarged perspective view of a portion of electrical power distribution system 100 including door 112 in the opened position. FIG. 3 is an enlarged perspective view of a portion of electrical power distribution system 100 including first pressure release mechanism 106 in a first position. FIG. 4 is an enlarged perspective view of a portion of electrical power distribution system 100 including first pressure release mechanism 106 in a second position. First pressure release mechanism 106 and second pressure release mechanism 108 each include a brace 138, tongues 140, biasing members 142, and stops 144. Brace 138 is configured to couple to case 110 and extend along door 112 and opening 114. In addition, braces 138 define openings for tongues 140 to extend through. Tongues 140 are configured to couple to door 112 on a first side of brace 138. Biasing members 142 are coupled to respective tongues 140 on a second side of brace 138 opposite door 112. Biasing members 142 extend between brace 138 and stops 144 and provide a biasing force to direct first pressure release mechanism 106 and second pressure release mechanism 108 towards a first position. Tongues 140 move to a second or extended position when a force acts on tongues 140 that is greater than the biasing force of biasing members 142. In alternative embodiments, first pressure release mechanism 106 and second pressure release mechanism 108 have any configuration that enables electrical power distribution system 100 to operate as described herein. For example, in some embodiments, biasing members 142 are coupled directly to door 112 and/or case 110.

In the exemplary embodiment, first pressure release mechanism 106 is positionable between the first position (FIG. 3) and the second position (FIG. 4) and allows door 112 to move relative to case 110. Door 112 is located a first distance 146 from case 110 when door 112 is in the closed position and first pressure release mechanism 106 is in the first position. Door 112 is located a second distance 148 from case 110 when door 112 is in the closed position and first pressure release mechanism 106 is in the second position. Second distance 148 is greater than first distance 146. In alternative embodiments, first pressure release mechanism 106 and second pressure release mechanism have any positions that enable electrical power distribution system 100 to operate as described herein.

Also, in the exemplary embodiment, during operation of electrical power distribution system 100, first pressure release mechanism 106 and second pressure release mechanism 108 allow door 112 to move relative to case 110 when pressure within interior space 109 exceeds a threshold value. For example, in some embodiments, biasing members 142 have a spring constant that is related to a threshold value for pressure within interior space 109. When the pressure within interior space 109 exceeds the threshold value, the biasing force of biasing members 142 is overcome and tongues 140 and door 112 move relative to case 110. As a result, the volume of interior space 109 is increased and the force acting on housing 104 due to the pressure within interior space 109 is reduced. When the pressure is below the threshold value, biasing members 142 move tongues 140 and door 112 into the first position. Biasing members 142 maintain tongues 140 in the first position when the pressure is below the threshold value. Accordingly, first pressure release mechanism 106 and second pressure release mechanism 108 allow reduction of pressure within interior space 109. In addition, first pressure release mechanism 106 and second pressure release mechanism 108 cause electrical power distribution system 100 to return to an initial configuration after an anomaly and reduce the need to repair and/or replace components of electrical power distribution system 100.

In reference to FIGS. 1-3, a method of assembling electrical power distribution system 100 includes positioning circuit protection device 102 within interior space 109 of housing 104. The method also includes positioning door 112 between a first position and a second position. In the first position, door 112 allows access to interior space 109 through opening 114 defined by case. In the closed position, door 112 covers opening 114 and inhibits access to interior space 109. The method further includes coupling first pressure release mechanism 106 and/or second pressure release mechanism 108 to housing 104 such that door 112 is displaceable relative to case 110 while door 112 is in the closed position. In some embodiments, the method includes coupling brace(s) 138 of first pressure release mechanism 106 and/or second pressure release mechanism 108 to case 110 such that brace(s) 138 extends at least partially along a perimeter of door 112 when door 112 is in the closed position. In further embodiments, the method includes coupling biasing member(s) 142 to tongue 140 between brace(s) 138 and stop(s) 144 of first pressure release mechanism 106 and/or second pressure release mechanism 108 such that biasing member(s) biases first pressure release mechanism 106 and/or second pressure release mechanism 108 towards the first position.

Figure 5:
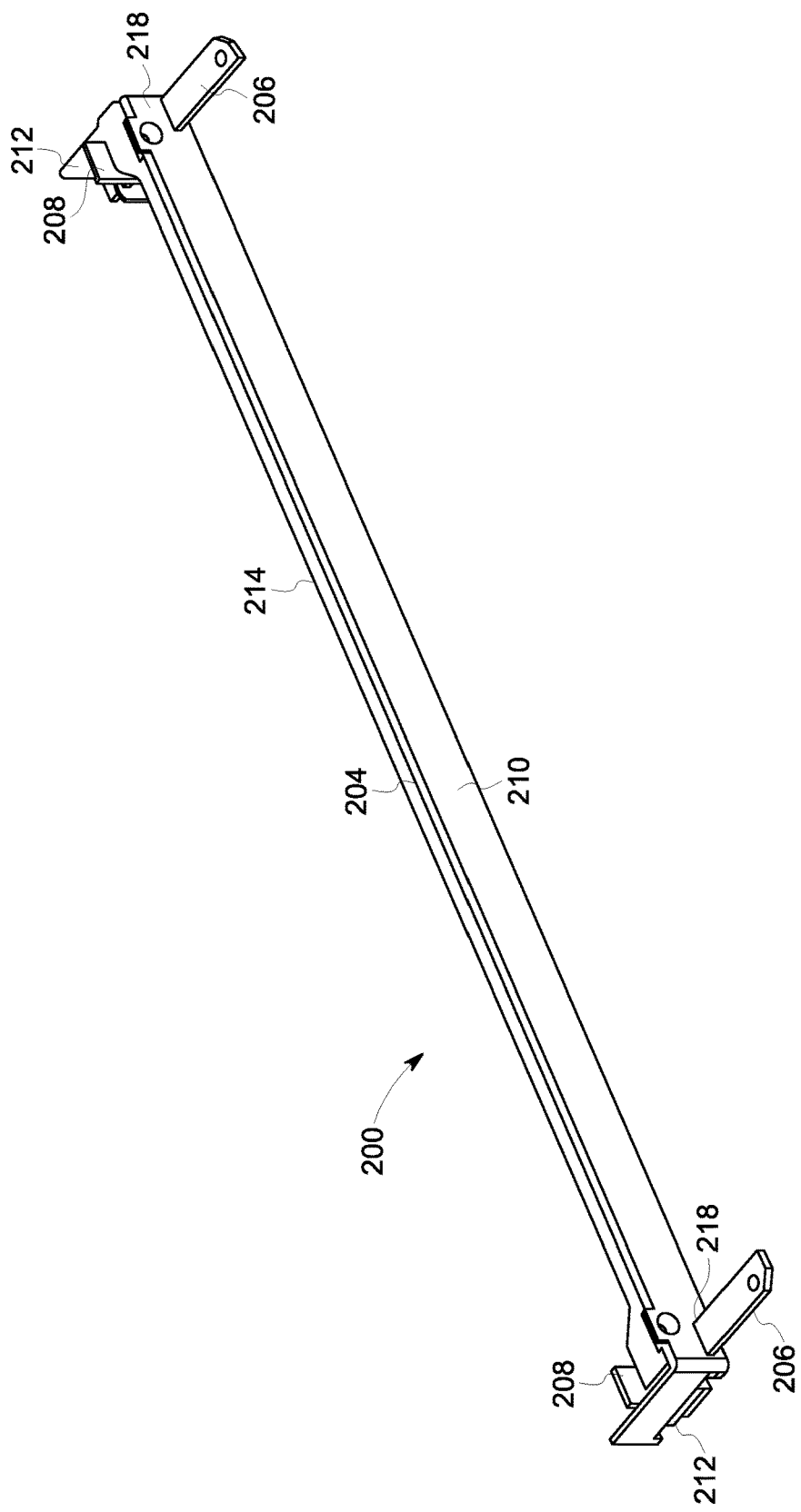
FIG. 5 is a top perspective view of an example embodiment of a pressure release mechanism for use with the electrical power distribution system shown in FIG. 1.
Figure 6:
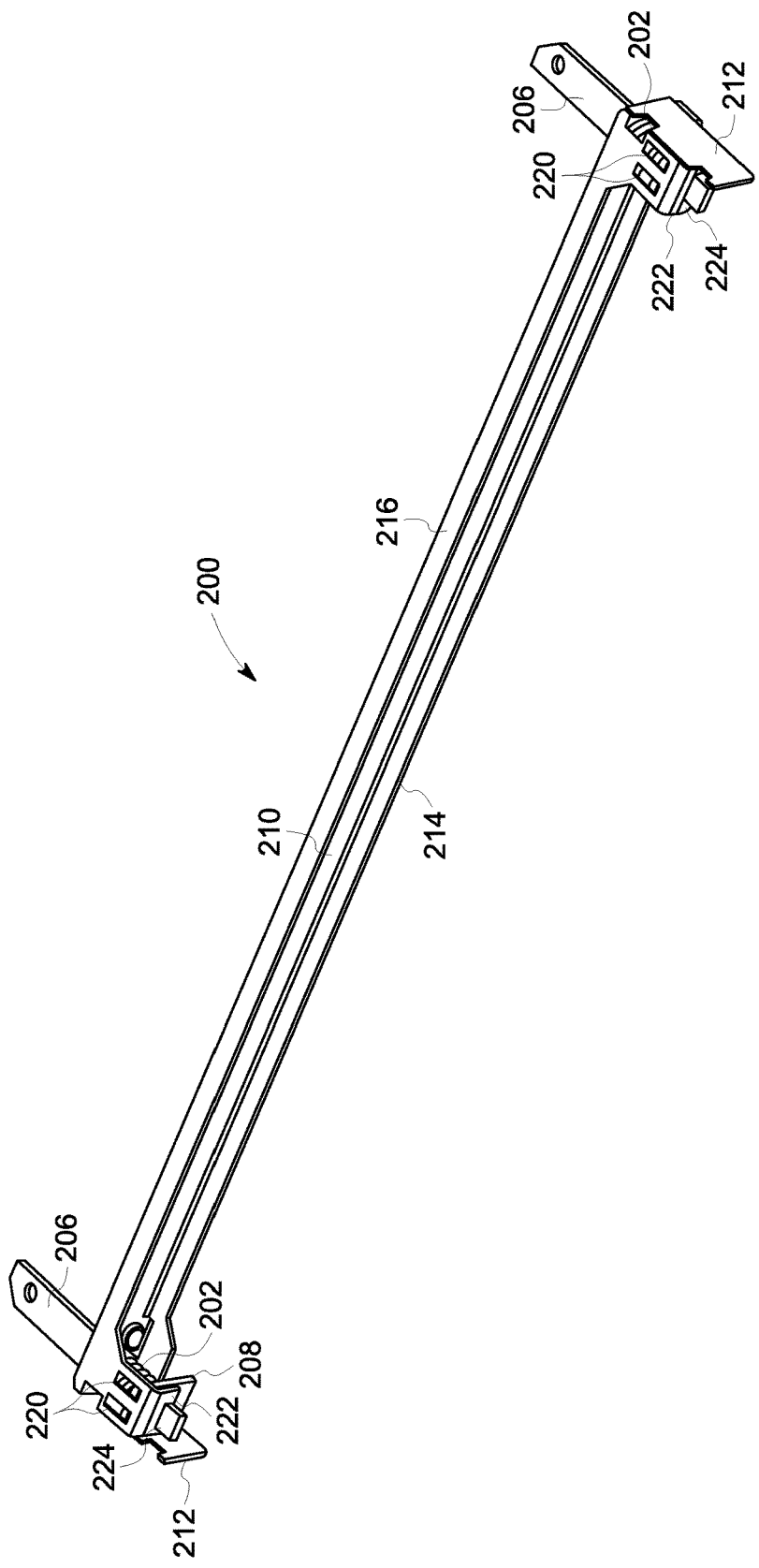
FIG. 6 is a bottom perspective view of the pressure release mechanism shown in FIG. 5.

FIG. 5 is a top perspective view of an example embodiment of a pressure release mechanism 200 for use with electrical power distribution system 100 (shown in FIG. 1). FIG. 6 is a bottom perspective view of pressure release mechanism 200. Pressure release mechanism 200 includes biasing members 202, a brace 204, tongues 206, and stops 208. Brace 204 is configured to couple to case 110 (shown in FIG. 1) adjacent door 112 (shown in FIG. 1) and opening 114 (shown in FIG. 1). Pressure release mechanism 200 is positionable between a first position and a second position. Accordingly, pressure release mechanism 200 allows door 112 (shown in FIG. 1) to move relative to case 110 (shown in FIG. 1). In alternative embodiments, pressure release mechanism 200 has any configuration that enables pressure release mechanism 200 to operate as described herein. For example, in some embodiments, at least one of biasing member 202, brace 204, tongue 206, and stop 208 is omitted.

Figure 7:
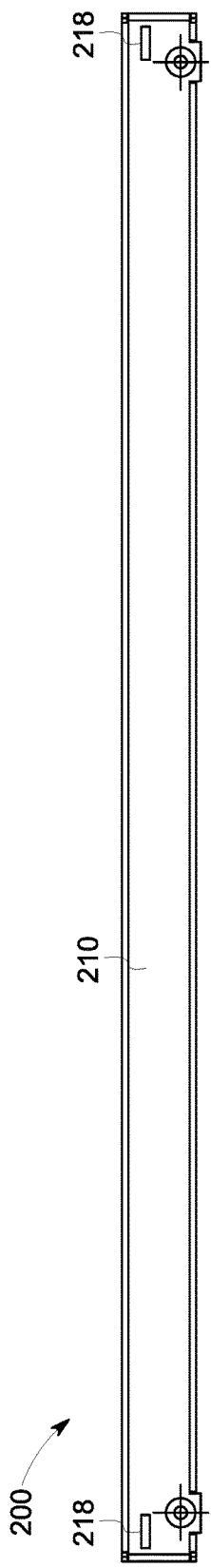
FIG. 7 is a front view of a brace of the pressure release mechanism shown in FIG. 5.
Figure 8:
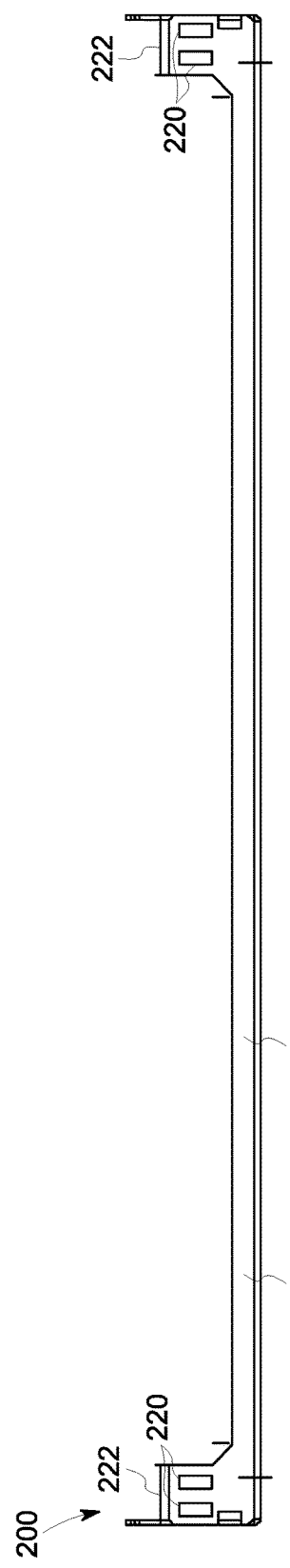
FIG. 8 is a top view of the brace shown in FIG. 7.
Figure 9:
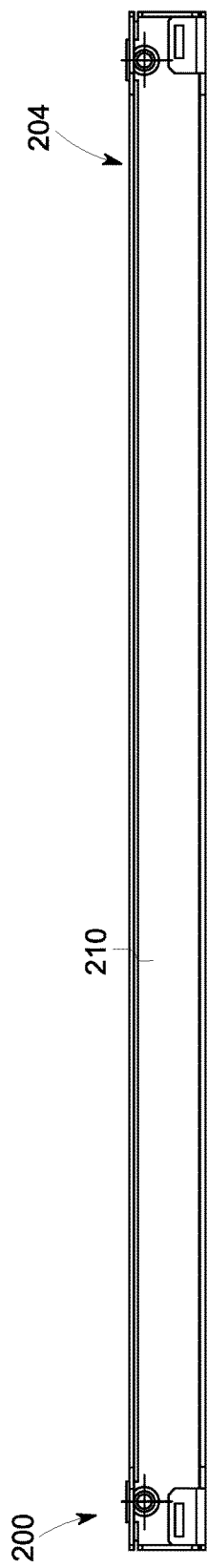
FIG. 9 is a rear view of the brace shown in FIG. 7.

FIG. 7 is a front view of brace 204 of pressure release mechanism 200. FIG. 8 is a top view of brace 204. FIG. 9 is a rear view of brace 204. Brace 204 includes a front wall 210, sidewalls 212, a top wall 214, and a bottom wall 216. Front wall 210 includes slots, broadly openings, 218 sized and shaped for tongues 206 (shown in FIG. 6) to extend therethrough and move relative to brace 204. Front wall 210 is elongate and arranged to extend along an edge of door 112 (shown in FIG. 1) throughout the full width of door 112. Slots 218 are positioned adjacent corners of brace 204 and allow tongues 206 to align with handle assembly 116 (shown in FIG. 1) and hinge pins 136 (shown in FIG. 1). Sidewalls 212 extend from opposite ends of front wall 210. Accordingly, in the exemplary embodiment, brace 204 has a U-shape. Top wall 214 and bottom wall 216 extend along opposite edges of front wall 210 between sidewalls 212. Bottom wall 216 includes leg openings 220 arranged to guide stop 208 (shown in FIG. 6). In addition, back plates 222 extend from bottom wall 216 and define openings 224. Accordingly, brace 204 is configured to movably support and guide tongues 206 (shown in FIG. 6). In alternative embodiments, pressure release mechanism 200 includes any brace 204 that enables pressure release mechanism 200. For example, in some embodiments, front wall 210 does not extend continuously along an edge of door 112 (shown in FIG. 1).

In addition, in the exemplary embodiment, pressure release mechanism 200 is constructed of metal components. For example, in some embodiments, biasing member 202, brace 204, tongue 206, and stop 208 are metal. In alternative embodiments, pressure release mechanism 200 includes any material that enables pressure release mechanism 200 to operate as described herein. For example, in some embodiments, pressure release mechanism 200 includes, without limitation, metal, wood, plastic, and combinations thereof.

Figure 10:
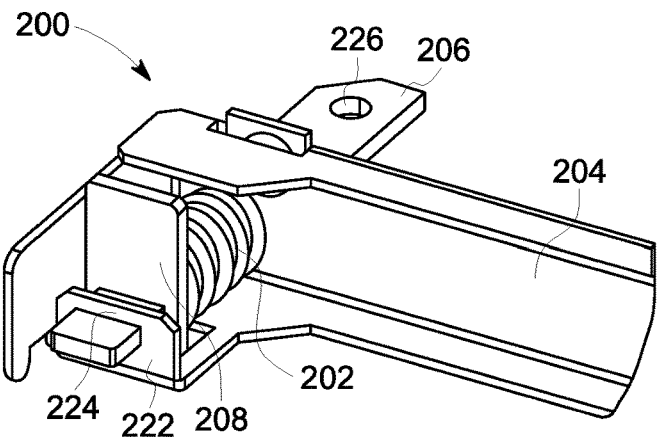
FIG. 10 is an enlarged perspective view of a portion of the pressure release mechanism shown in FIG. 5.
Figure 11:
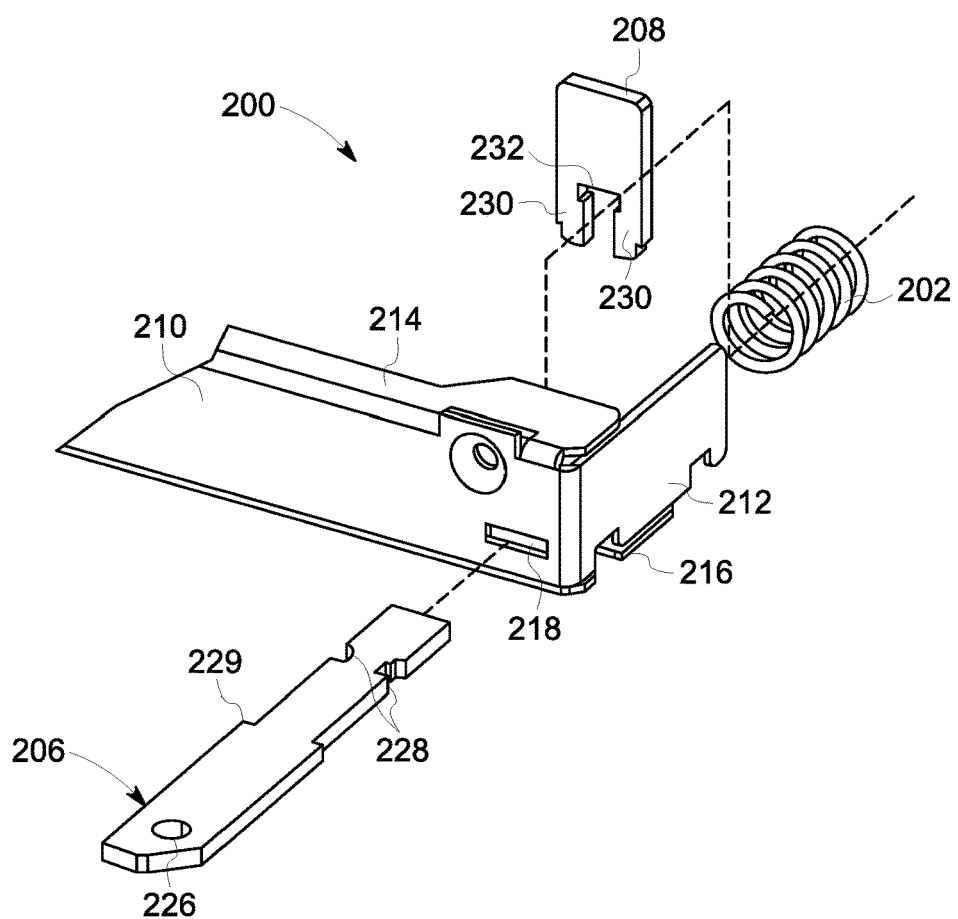
FIG. 11 is an assembly view of a portion of the pressure release mechanism shown in FIG. 5.

FIG. 10 is an enlarged perspective view of a portion of pressure release mechanism 200. FIG. 11 is an assembly view of a portion of pressure release mechanism 200. In the exemplary embodiment, tongues 206 are movably supported by brace 204. For example, tongues 206 extend through slots 218 in front wall 210 and openings 224 in back plates 222 such that tongues 206 are movable relative to brace 204. In addition, tongues 206 are configured to couple to door 112 (shown in FIG. 1) such that door 112 is movable with tongues 206. Each tongue 206 is elongate and flat. In addition, tongues 206 have a thickness that is less than the height of slots 218 to allow tongues 206 to extend through slots 218 and move relative to brace 204. Each tongue 206 defines an opening 226 and notches 228. Openings 226 are configured to receive hinge pins 136 and/or handle assembly 116. Notches 228 are configured to engage stops 208. In addition, a width of each tongue 206 varies along its length such that a portion of each tongue 206 is wider than slots 218 and a step 229 of tongue 206 contacts front wall 210. Accordingly, at least a portion of each tongue 206 extends on either side of front wall 210 when tongues 206 are coupled to brace 204. In alternative embodiments, pressure release mechanism 200 includes any tongue 206 that enables pressure release mechanism 200 to operate as described herein.

Also, in the exemplary embodiment, stops 208 are coupled to tongues 206 and are configured to limit movement of tongues 206. Each stop 208 is substantially U-shaped and includes legs 230 defining an opening 232 configured to receive tongues 206. Legs 230 are configured to extend through notches 228 and engage tongue 206. In addition, legs 230 extend into leg openings 220 and are arranged to contact a first edge of brace 204 when tongue 206 is in a first position and a second edge of brace 204 when tongue 206 is in a second position. Accordingly, the range of movement of tongue 206 is restricted by stops 208 and by the length of leg openings 220. In alternative embodiments, pressure release mechanism 200 includes any stop 208 that enables pressure release mechanism 200 to operate as described herein. For example, in some embodiments, stop 208 and tongues 206 are integrally formed.

Moreover, in the exemplary embodiment, biasing members 202 are coupled to tongues 206 and extend between braces 204 and stops 208. Biasing members 202 are configured to bias tongues 206 towards the first position. In the exemplary embodiment, biasing members 202 include compression springs extending about tongues 206. In alternative embodiments, pressure release mechanism 200 includes any biasing member 202 that enables pressure release mechanism 200 to operate as described herein. For example, in some embodiments, pressure release mechanism 200 includes an elastic member, a coil spring, a leaf spring, and/or any other suitable biasing member.

The electrical power distribution systems described above generally include a housing defining an interior space configured to receive a circuit protection device. The housing includes a case and a door that is positionable between an opened position and a closed position. A pressure release mechanism is coupled to the door and allows the door to move relative to the case while the door is in the closed position. In some embodiments, the pressure release mechanism includes a biasing member that biases the door towards the case. As a result, the electrical power distribution system is able to withstand overcurrent conditions, ground fault conditions, or other system anomalies. In addition, the electrical power distribution system is arranged to return to an initial position and does not require repairs or replacement after such anomalies.

An exemplary technical effect of the methods, systems, and apparatus described herein includes at least one of: (a) reducing deformation of electrical power distribution systems during anomalies such as overcurrent conditions and ground fault conditions; (b) providing housings that are suitable for use with circuit protection devices that have higher current parameters than known systems; (c) decreasing the cost to assemble and maintain electrical power distribution systems; and (d) reducing the risk of electrical current passing to the surrounding environment during and after anomalies such as overcurrent conditions and ground fault conditions.

Exemplary embodiments of electrical power distribution systems and methods of assembling electrical power distribution systems are described above in detail. The electrical power distribution systems and methods are not limited to the specific embodiments described herein but, rather, components of the circuit breakers and/or operations of the methods may be utilized independently and separately from other components and/or operations described herein. Further, the described components and/or operations may also be defined in, or used in combination with, other systems, methods, and/or devices, and are not limited to practice with only the electrical power distribution systems described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical power distribution system comprising:
   at least one circuit protection device arranged to interrupt current flowing through a circuit; and
   a housing defining an interior space and arranged to receive said at least one circuit protection device within the interior space, said housing comprising:
      a case defining an opening providing access into the interior space;
      a door positionable between an opened position in which said door allows access to the interior space and a closed position in which said door covers the opening and inhibits access to the interior space;
      a hinge pivotably coupling said door to said case; and
      a pressure release mechanism coupled to said case and said hinge, wherein said pressure release mechanism extends along at least one side of said door and is coupled to said door adjacent a first corner and a second corner of said door when said door is in the closed position, said pressure release mechanism comprising:
         a tongue positionable between a first position and a second position, wherein said tongue is coupled to said door and is arranged to allow said door to move relative to said case while said door is in the closed position;
         a biasing member arranged to bias said door towards said case when said door is in the closed position;
         a hinge pin coupled to said pressure release mechanism adjacent said first corner; and
         a handle assembly arranged to engage said pressure release mechanism adjacent said second corner when said door is in the closed position.

2. The electrical power distribution system in accordance with claim 1, wherein said biasing member is coupled to said tongue and arranged to bias said tongue towards the first position.

3. The electrical power distribution system in accordance with claim 1, wherein said pressure release mechanism comprises a brace coupled to said case and extending at least partially along a perimeter of said door when said door is in the closed position.

4. The electrical power distribution system in accordance with claim 3, wherein said tongue extends from and is movably coupled to said brace.

5. The electrical power distribution system in accordance with claim 4, wherein said pressure release mechanism further comprises a stop arranged to limit movement of said tongue.

6. The electrical power distribution system in accordance with claim 5, wherein said biasing member is coupled to said tongue and extends between said brace and said stop.

7. The electrical power distribution system in accordance with claim 1, wherein said door is spaced a first distance from said case when said tongue is in the first position and said door is in the closed position, wherein said door is spaced a second distance from said case when said tongue is in the second position and said door is in the closed position, and wherein the second distance is greater than the first distance.

8. The electrical power distribution system in accordance with claim 1, wherein said pressure release mechanism is a first pressure release mechanism comprising a first brace arranged to extend along a first side of said door, said housing further comprising a second pressure release mechanism comprising a second brace arranged to extend along a second side of said door opposite said first brace.

9. A pressure release mechanism for an electrical power distribution system, said pressure release mechanism including:
   a brace arranged to couple to a case and a door of the electrical power distribution system, wherein the door is positionable between an opened position in which the door allows access to an interior space of the case through an opening defined by the case and a closed position in which the door covers the opening and inhibits access to the interior space, and wherein the opening provides access to at least one circuit protection device positioned within the interior space of the case;
   a tongue extending through an opening defined in said brace and movably coupled to said brace, wherein said tongue is positionable between a first position and a second position, wherein said tongue is coupled to the door and is arranged to allow the door to move relative to the case while the door is in the closed position; and
   a biasing member in contact with said brace and a stop, said biasing member arranged to bias said tongue towards the first position.

10. The pressure release mechanism in accordance with claim 9, wherein the stop is arranged to limit movement of said tongue.

11. The pressure release mechanism in accordance with claim 10, wherein said biasing member extends between said brace and said stop.

12. The pressure release mechanism in accordance with claim 9, wherein said biasing member is coupled to said tongue on a first side of said brace, and wherein said tongue is coupled to the door on a second side of said brace opposite said biasing member.

13. The pressure release mechanism in accordance with claim 9, wherein said tongue is a first tongue extending from and movably coupled to said brace adjacent a first end, said pressure release mechanism further comprising a second tongue extending from and movably coupled to said brace adjacent a second end.

14. A method of assembling an electrical power distribution system, said method comprising:

positioning a circuit protection device within an interior space of a housing including a case and a door, wherein the door is positionable between an opened position in which the door allows access to the interior space through an opening defined by the case and a closed position in which the door covers the opening and inhibits access to the interior space;

coupling a pressure release mechanism to the case so that the pressure release mechanism extends along at least one side of the door and is coupled to the door adjacent a first corner and a second corner of the door when the door is in the closed position, the pressure release mechanism including a tongue positionable between a first position and a second position;

coupling a hinge to the door and the case such that the door is arranged to pivot between the opened position and the closed position;

coupling the hinge to the tongue, wherein the tongue is arranged to allow the door to move relative to the case while the door is in the closed position;

coupling a hinge pin to the pressure release mechanism adjacent the first corner; and arranging a handle assembly to engage the pressure release mechanism adjacent the second corner when the door is in the closed position.

15. The method in accordance with claim 14 further comprising providing a biasing member arranged to bias the tongue of the pressure release mechanism towards the first position.

16. The method in accordance with claim 14 further comprising coupling a brace of the pressure release mechanism to the case such that the brace extends at least partially along a perimeter of the door when the door is in the closed position.

17. The method in accordance with claim 16, wherein coupling the hinge to the tongue comprises extending the tongue through an opening defined by the brace such that the door and the tongue are movable relative to the brace while the door is in the closed position.

18. The method in accordance with claim 17 further comprising coupling a stop to the tongue.

\* \* \* \* \*